(12) United States Patent
Chen

(10) Patent No.: US 8,161,354 B2
(45) Date of Patent: Apr. 17, 2012

(54) FLASH MEMORY CONTROLLER HAVING CONFIGURING UNIT FOR ERROR CORRECTION CODE (ECC) CAPABILITY AND METHOD THEREOF

(75) Inventor: Ju-peng Chen, Taipei (TW)

(73) Assignee: Genesys Logic, Inc., Shindian (TW)

( * ) Notice: Subject to any disclaimer, the term of this patent is extended or adjusted under 35 U.S.C. 154(b) by 853 days.

(21) Appl. No.: 12/252,431

(22) Filed: Oct. 16, 2008

(65) Prior Publication Data
US 2010/0100763 A1     Apr. 22, 2010

(51) Int. Cl.
*G06F 11/00* (2006.01)
(52) U.S. Cl. .................................... 714/763; 714/6.13
(58) Field of Classification Search ............... 714/6.13, 714/42, 763–773
See application file for complete search history.

(56) References Cited

U.S. PATENT DOCUMENTS

| | | | |
|---|---|---|---|
| 4,513,420 A * | 4/1985 | Collins et al. ............... | 714/766 |
| 5,541,939 A * | 7/1996 | Im .............................. | 714/765 |
| 5,581,567 A * | 12/1996 | Chen et al. .................. | 714/758 |
| 6,993,690 B1 * | 1/2006 | Okamoto ..................... | 714/718 |
| 7,765,426 B2 * | 7/2010 | Li ................................ | 714/6.13 |
| 7,861,139 B2 * | 12/2010 | Murray et al. ............... | 714/763 |
| 8,010,876 B2 * | 8/2011 | Hsieh et al. ................. | 714/773 |
| 2008/0072120 A1 * | 3/2008 | Radke ......................... | 714/768 |
| 2009/0013233 A1 * | 1/2009 | Radke ......................... | 714/752 |
| 2009/0132889 A1 * | 5/2009 | Radke ......................... | 714/763 |

\* cited by examiner

*Primary Examiner* — Robert Beausoliel, Jr.
*Assistant Examiner* — Elmira Mehrmanesh
(74) *Attorney, Agent, or Firm* — Kirton McConkie; Evan R. Witt

(57) ABSTRACT

A flash memory controller includes a control unit, a buffer, an error correction code (ECC) module, and a configuring unit. The flash memory has a data area for storing the data content and a first spare area for storing a first ECC value corresponding to the data content. The ECC module utilizes the data content for generating a second ECC value and comparing the second ECC value with the first ECC value to determine whether the data content comprises a plurality of errors. The configuring unit computes the amount of the errors to determine whether the amount of the errors exceeds a predetermined threshold. If The configuring unit configures the data area and assigns a portion of the data area to be a second spare area. The first and the second spare area are associated with the ECC capability to allow the ECC module to correct the errors.

15 Claims, 2 Drawing Sheets

FLASH MEMORY CONTROLLER HAVING CONFIGURING UNIT FOR ERROR CORRECTION CODE (ECC) CAPABILITY AND METHOD THEREOF

FIELD OF THE INVENTION

The present invention relates to a memory apparatus and method thereof, and more particularly relates to a flash memory controller having a configuring unit for error correction code (ECC) capability based on usage status of the flash memory and method thereof.

BACKGROUND OF THE INVENTION

Flash is a non-volatile memory that can retain the data stored therein even after power is removed. NAND (Not AND) flash, which is one type of Flash, is a high-density memory design and has certain advantages over other types of memory. In particular, NAND flash has large storage capacity, e.g. one Giga bits or more, good continuous access speed for flash memory, and low cost.

The error correction code (ECC) is a common function in NAND flash memory controller for the advanced process of flash memory. The NAND flash memory with multi-level cell (MLC) has a benefit of low cost and is widely utilized in the solid state drive (SSD). However, NAND flash also has certain inherent drawbacks, such as poor read endurance. Because the error correction code (ECC) capability for the NAND flash memory is restricted, the poor read endurance of the NAND flash memory with multi-level cell (MLC) is too low to provide better reliability for the application of solid state drive (SSD). Consequentially, there is a need to develop a novel flash memory to solve the aforementioned problem.

SUMMARY OF THE INVENTION

One objective of the present invention is to provide a flash memory controller having a configuring unit for boosting the error correction code (ECC) capability in the flash memory controller based on the usage status of the flash memory.

Another objective of the present invention is to provide a flash memory controller for increasing the error correction code (ECC) capability in order to improve the read and write endurance of the flash memory.

According to the above objectives, the present invention comprises the flash memory controller having the configuring unit for configuring the error correction code (ECC) capability in the flash memory controller. The flash memory controller includes a control unit, a buffer, an ECC module, and a configuring unit. The flash memory controller controls the configuring unit to adaptively configure the error correction code (ECC) capability of a flash memory. The error correction coding (ECC) is typically used for the flash memory to provide data integrity and ensure reliable access to the flash memory. For example, the flash memory is a NAND flash memory.

The control unit generates a reading command for reading data content in the flash memory. The flash memory has a data area for storing the data content and the first spare area for storing a first ECC value corresponding to the data content. For example, the pages of the flash memory store the data content. The buffer stores the data content which is read from the data area in the flash memory. The ECC module utilizes the data content for generating a second ECC value and compares the second ECC value with the first ECC value to determine whether the data content comprises a plurality of errors based on the compared result of the first ECC value and the second ECC value. Therefore, if the number of errors exceeds a predefined threshold, the configuring unit is capable of boosting the ECC capability in the flash memory controller.

The configuring unit computes the amount of the errors if the data content has the errors to determine whether the amount of the errors exceeds a predetermined threshold. If the amount of the errors exceeds the predetermined threshold, the configuring unit configures the data area of the flash memory via the control unit for assigning a portion of the data area to be the second spare area. The storage capacity of the first spare area and the second spare area is associated with the ECC capability to allow the ECC module to correct the errors. The ECC module corrects the errors based on the compared result of the first ECC value and the second ECC value if the amount of the errors is less than the predetermined threshold.

In operation, the method of adaptively configuring an error correction code (ECC) capability of a flash memory comprises the steps of:

generating a reading command for reading data content in the flash memory;

generating a second ECC value for the data content which is read from the flash memory;

comparing the second ECC value with the first ECC value to determine whether the data content comprises a plurality of errors based on the compared result of the first ECC value and the second ECC value;

computing the amount of the errors if the data content has the errors to determine whether the amount of the errors exceeds a predetermined threshold; and configuring the data area of the flash memory for assigning a portion of the data area to be a second spare area if the amount of the errors exceeds the predetermined threshold, wherein the storage capacity of the first spare area and the second spare area is associated with the ECC capability to allow the ECC module to correct the errors.

The present invention uses a portion of storage capacity for implementing advanced ECC mechanism in order to improve the reliability of the NAND flash memory. The ECC mechanism having multi-stage correction according to the usage status of the flash memory adaptively corrects the data of the flash memory. Therefore, the additional ECC capability generated by the portion of storage capacity provides longer life span of the flash memory.

BRIEF DESCRIPTION OF THE DRAWINGS

The foregoing aspects and many of the advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
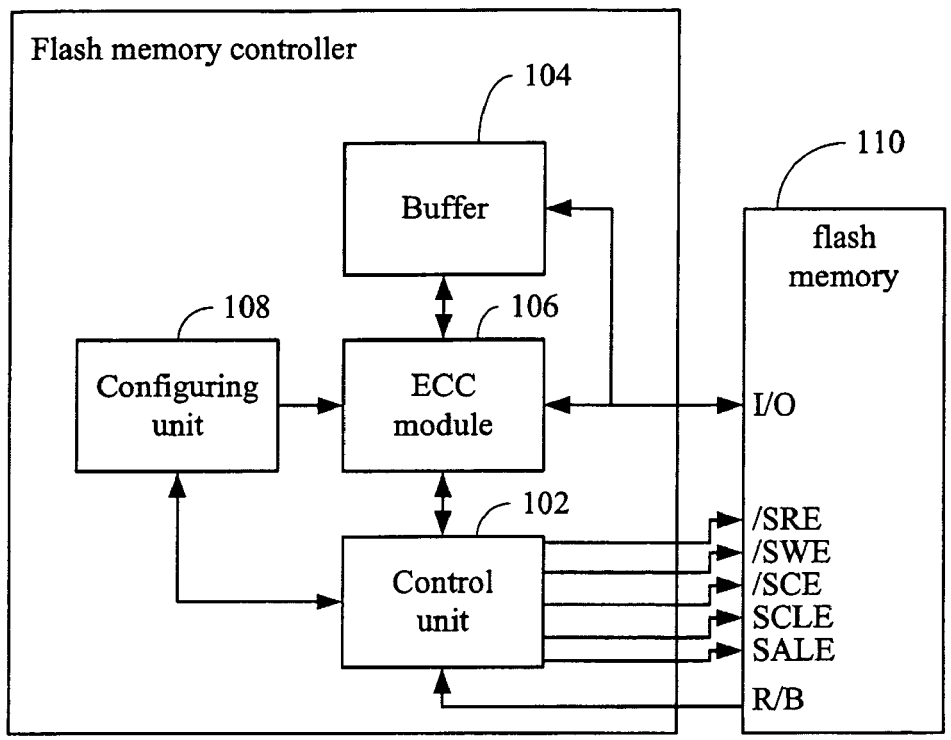
FIG. 1 is a schematic block diagram of a flash memory controller having a configuring unit for adaptively configuring the error correction code (ECC) capability according to one embodiment of the present invention.

FIG. 1 is a schematic block diagram of a flash memory controller 100 having a configuring unit for adaptively configuring the error correction code (ECC) capability according to one embodiment of the present invention. The flash memory controller 100 includes a control unit 102, a buffer 104, an ECC module 106, and a configuring unit 108. The flash memory controller 100 controls the configuring unit 108 to adaptively configure the error correction code (ECC) capability of a flash memory I 10. The error correction coding (ECC) is typically used for the flash memory to provide data integrity and ensure reliable access to the flash memory. For example, the flash memory is a NAND flash memory.

Figure 2:
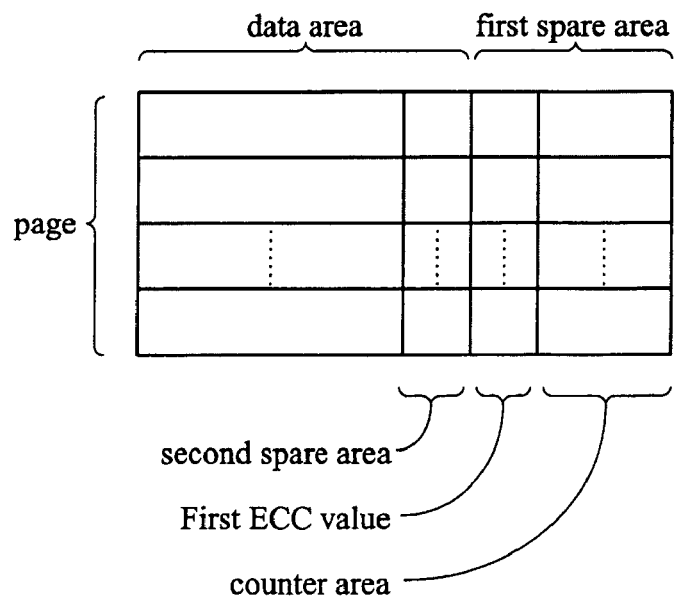
FIG. 2 is a schematic exemplary structure of NAND flash memory having a first spare area and a second spare area according to one embodiment of the present invention.

The flash memory controller 100 couples to the flash memory 110. The control unit 102 couples the configuring unit 108 to the flash memory 110 via a plurality of control signals. The control unit 102 further generates a writing command for writing the data content to the flash memory 110 and writes the first ECC value to the first spare area (as shown in FIG. 2). The ECC module 106 and the configuring unit 108, respectively, are coupled to the control unit 102. The buffer 104 couples to the ECC module 106 and the flash memory 110, respectively.

Please refer to FIG. 1 and FIG. 2. FIG. 2 is a schematic exemplary structure of NAND flash memory having a first spare area and a second spare area according to one embodiment of the present invention. The control unit 102 generates a reading command for reading data content in the flash memory 110. The flash memory 110 has a data area for storing the data content and the first spare area for storing a first ECC value corresponding to the data content. For example, the pages of the flash memory store the data content. The buffer 104 stores the data content which is read from the data area in the flash memory 110. The ECC module 106 utilizes the data content for generating a second ECC value and compares the second ECC value with the first ECC value to determine whether the data content comprises a plurality of errors based on the compared result of the first ECC value and the second ECC value.

The configuring unit 108 computes the amount of the errors if the data content has the errors to determine whether the amount of the errors exceeds a predetermined threshold. If the amount of the errors exceeds the predetermined threshold, the configuring unit 108 configures the data area of the flash memory 110 via the control unit 102 for assigning a portion of the data area to be the second spare area. The storage capacity of the first spare area and the second spare area is associated with the ECC capability to allow the ECC module 106 to correct the errors. The ECC module 106 corrects the errors based on the compared result of the first ECC value and the second ECC value if the amount of the errors is less than the predetermined threshold.

According to the above-mentioned descriptions, if the number of errors exceeds a predefined threshold, the configuring unit 108 is capable of boosting the ECC capability in the flash memory controller 102.

The first spare area further comprises a counter area for storing a counter value to determine whether the configuring unit 108 configures the data area for generating the second spare area. The configuring unit 108 configures the data area of the flash memory 110 for assigning a portion of the data area to be the second spare area if the counter value exceeds a predetermined counting value. In one embodiment, the predetermined counting value is a value of a wear leveling counter.

In one embodiment, the ECC capability is represented by the bits per predetermined bytes for the flash memory 110. The storage capacity of the first spare area and the second spare area is proportional to the ECC capability.

Please refer back to FIG. 1. The control signals of the flash memory include a command latch enable signal (SCLE), a chip enable signal (/SCE), a write enable signal (/SWE), a address latch enable signal (SALE), a read enable signal (/SRE), an input/output (I/O) signal, and a ready/busy status signal. The chip enable signal (/SCE) represents that the flash memory is active while the flash memory is enabled by the secondary controller of the flash memory controller. For example, the flash memory is active while the chip enable signal (/SCE) is at low level. The write enable signal (/SWE) represents that the flash memory can be written by the flash memory controller while the write enable signal (/SWE) is active, e.g. at a low level.

The read enable signal (/SRE) represents that the flash memory can be read by the secondary controller of the flash memory controller while the read enable signal (/SRE) is active, e.g. at a low level. While the command latch enable signal (SCLE) is active, the command is latched at the rising edge of the write enable signal (/SWE). While the address latch enable signal (SALE) is active, the address is latched at the rising edge of the write enable signal (/SWE). The input/output (I/O) signal represents the data signal transferred between the flash memory and the data buffer of the flash memory controller. The ready/busy (R/B) status signal represents the status of the flash memory to be reported to the flash memory controller.

Each data byte of the selected page is then written to the NAND flash 110 by providing the proper /SWE signal to the NAND flash 110. The data byte is also received by ECC module 106 and used to generate an ECC value for the page. After all data bytes for the selected page have been written to the NAND flash 110, the ECC value generated for the page is written to the spare area for the selected page. After the entire ECC value has been written, a confirm write command is sent to the NAND flash and the NAND flash is thereafter disabled by bringing the /SCE signal to high level.

Figure 3:
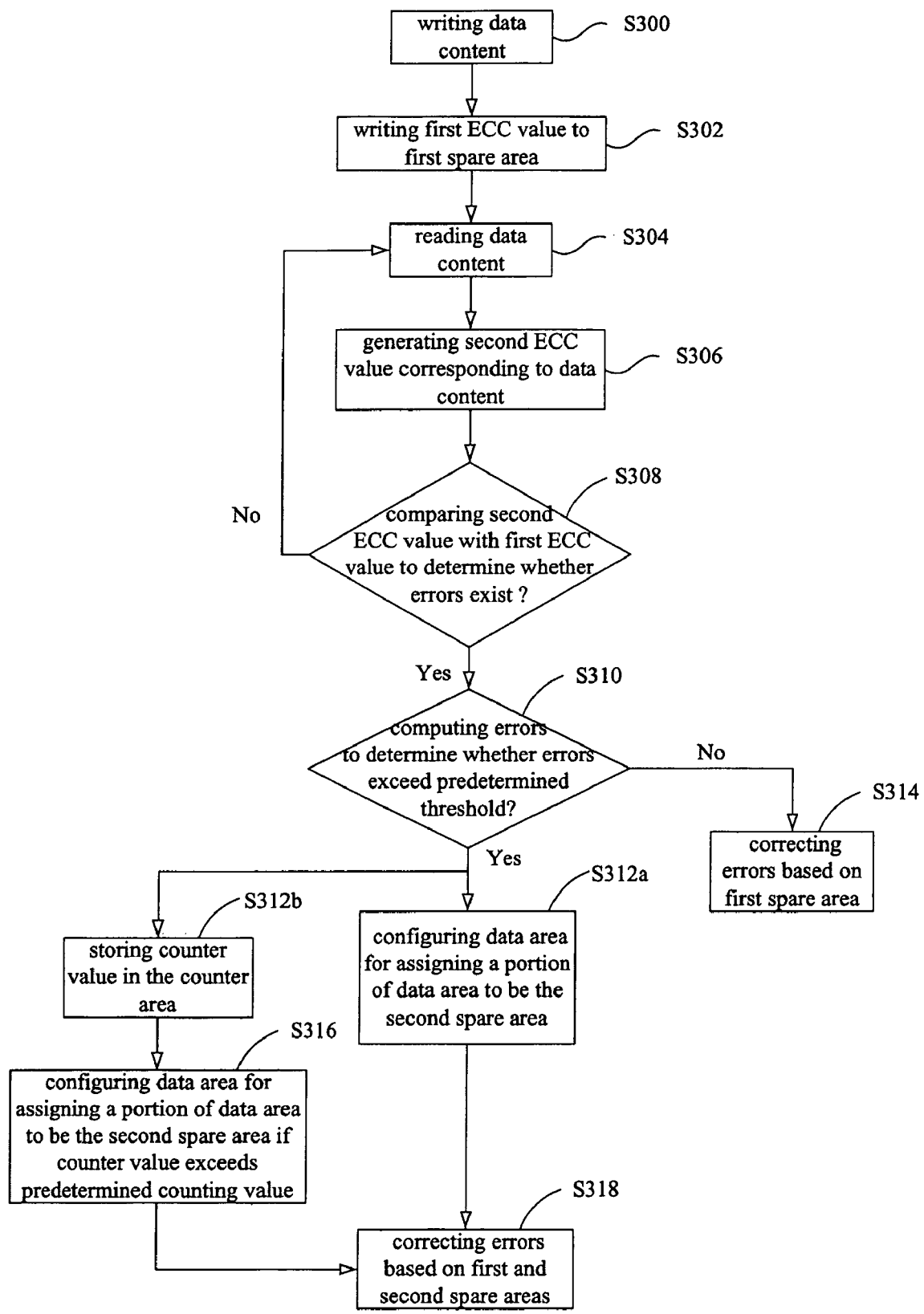
FIG. 3 is a flow chart of performing the flash memory controller for adaptively configuring the error correction code (ECC) capability according to one embodiment of the present invention.

Please refer to FIG. 1, FIG. 2, and FIG. 3. FIG. 3 is a flow chart of performing the flash memory controller 100 for adaptively configuring the error correction code (ECC) capability according to one embodiment of the present invention. The flash memory controller 100 includes a control unit 102, a buffer 104, an ECC module 106, and a configuring unit 108. The method of adaptively configuring an error correction code (ECC) capability of a flash memory 110 comprises the following steps. The flash memory 110 has a data area for storing the data content and a first spare area for storing a first ECC value corresponding to the data content, and the first spare area further comprises a counter area.

In step S300, the control unit 102 generates a writing command for writing the data content to the flash memory.

In step S302, the control unit 102 writes the first ECC value to the first spare area.

In step S304, the control unit 102 generates a reading command for reading data content in the flash memory.

In step S306, the ECC module 106 generates a second ECC value for the data content which is read from the flash memory.

In step S308, the ECC module 106 compares the second ECC value with the first ECC value to determine whether the data content comprises a plurality of errors based on the compared result of the first ECC value and the second ECC value. If no, return to step S304. If yes, proceed to step S310.

In step S310, the configuring unit 108 computes the amount of the errors if the data content has the errors to determine whether the amount of the errors exceeds a predetermined threshold. If yes, proceed to steps S312a and S312b. If no, proceed to step S314.

In step S312a, the configuring unit 108 configures the data area of the flash memory for assigning a portion of the data area to be a second spare area if the amount of the errors exceeds the predetermined threshold. The storage capacity of the first spare area and the second spare area is associated with the ECC capability to allow the ECC module to correct the errors. Then, the method proceeds to step S318.

In step S312b, the first spare area stores a counter value in the counter area to determine whether the configuring unit 108 configures the data area for generating the second spare area. In step S316 after step S312b, the configuring unit 108 configures the data area of the flash memory for assigning a portion of the data area to be the second spare area if the counter value exceeds a predetermined counting value.

In step S314, the ECC module 106 corrects the errors based on the first ECC value stored in the first spare area and the second ECC value.

In step S318, the ECC module 106 corrects the errors based on the first ECC value and the second ECC value, which are stored in the first spare area and second spare area.

The present invention uses a portion of storage capacity for implementing advanced ECC mechanism in order to improve the reliability of the NAND flash memory. The ECC mechanism having multi-level correction according to the usage status of the flash memory adaptively corrects the data of the flash memory. Therefore, the additional ECC capability generated by the portion of storage capacity provides longer life span of the flash memory.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A flash memory controller for adaptively configuring an error correction code (ECC) capability of a flash memory, the flash memory controller comprising:
   a control unit, generating a reading command for reading data content in the flash memory, wherein the flash memory has a data area for storing the data content and a first spare area for storing a first ECC value corresponding to the data content;
   a buffer for storing the data content which is read from the data area in the flash memory;
   an ECC module coupled to the control unit and the buffer, utilizing the data content for generating a second ECC value and comparing the second ECC value with the first ECC value to determine whether the data content comprises a plurality of errors based on the compared result of the first ECC value and the second ECC value; and
   a configuring unit coupled to the ECC module and the control unit, computing an amount of the errors if the data content has the errors to determine whether the amount of the errors exceeds a predetermined threshold;
   wherein if the amount of the errors exceeds the predetermined threshold, the configuring unit configures the data area of the flash memory via the control unit for assigning a portion of the data area to be a second spare area, and a storage capacity of the first spare area and the second spare area is associated with the ECC capability to allow the ECC module to correct the errors, and wherein the ECC module corrects the errors based on the compared result of the first ECC value and the second ECC value if the amount of the errors is less than the predetermined threshold.

2. The flash memory controller of claim 1, wherein the first spare area further comprises a counter area for storing a counter value to determine whether the configuring unit configures the data area for generating the second spare area.

3. The flash memory controller of claim 2, wherein the configuring unit configures the data area of the flash memory for assigning a portion of the data area to be the second spare area if the counter value exceeds a predetermined counting value.

4. The flash memory controller of claim 3, wherein the predetermined counting value is a value of a wear leveling counter.

5. The flash memory controller of claim 1, wherein the control unit further generates a writing command for writing the data content to the flash memory and writes the first ECC value to the first spare area.

6. The flash memory controller of claim 1, wherein the ECC capability is represented by a plurality of bits per predetermined bytes for the flash memory.

7. The flash memory controller of claim 6, wherein the storage capacity of the first spare area and the second spare area is proportional to the ECC capability.

8. The flash memory controller of claim 1, wherein the flash memory is a NAND flash memory.

9. A method of adaptively configuring an error correction code (ECC) capability of a flash memory, wherein the flash memory has a data area for storing the data content and a first spare area for storing a first ECC value corresponding to the data content, and the first spare area further comprises a counter area, the method comprising the steps of:
   generating a reading command for reading data content in the flash memory;
   generating a second ECC value for the data content which is read from the flash memory;
   comparing the second ECC value with the first ECC value to determine whether the data content comprises a plurality of errors based on the compared result of the first ECC value and the second ECC value;
   computing an amount of the errors if the data content has the errors to determine whether the amount of the errors exceeds a predetermined threshold; and
   configuring the data area of the flash memory for assigning a portion of the data area to be a second spare area if the amount of the errors exceeds the predetermined threshold, wherein a storage capacity of the first spare area and the second spare area is associated with the ECC capability to allow the ECC module to correct the errors, and wherein the ECC module corrects the errors based on the compared result of the first ECC value and the second ECC value if the amount of the errors is less than the predetermined threshold.

10. The method of claim 9, after the step of computing the amount of the errors, further comprising a step of storing a counter value in the counter area to determine whether the configuring unit configures the data area for generating the second spare area.

11. The method of claim 10, after the step of storing a counter value in the counter area, further comprising a step of configuring the data area of the flash memory for assigning a portion of the data area to be the second spare area if the counter value exceeds a predetermined counting value.

12. The method of claim 11, wherein the predetermined counting value is a value of a wear leveling counter.

13. The method of claim 9, before the step of generating a reading command for reading data content in the flash memory, further comprising a step of generating a writing command for writing the data content to the flash memory.

14. The method of claim 13, after the step of generating the writing command, further a step of writing the first ECC value to the first spare area.

15. The method of claim 9, wherein the ECC capability is represented by the bits per predetermined bytes for the flash memory.

* * * * *